United States Patent [19]

Tateno et al.

[11] Patent Number: 4,984,207

[45] Date of Patent: Jan. 8, 1991

[54] SEMICONDUCTOR MEMORY DEVICE

[75] Inventors: Minoru Tateno; Akira Ide, both of Takasaki, Japan

[73] Assignee: Hitachi, Ltd., Tokyo, Japan

[21] Appl. No.: 490,550

[22] Filed: Mar. 5, 1990

Related U.S. Application Data

[63] Continuation of Ser. No. 216,652, Jul. 7, 1988, abandoned.

[30] Foreign Application Priority Data

Jul. 10, 1987 [JP] Japan .................. 62-170909

[51] Int. Cl.$^5$ ............................................ G11C 11/34
[52] U.S. Cl. .................... 365/208; 365/225.6; 307/530
[58] Field of Search ............ 365/205, 207, 208, 225.6, 365/189.11; 307/530

[56] References Cited

U.S. PATENT DOCUMENTS

| | | | |
|---|---|---|---|
| 4,027,176 | 5/1977 | Heuber et al. | 365/208 X |
| 4,335,449 | 6/1982 | Nokubo | 365/177 |
| 4,604,533 | 8/1986 | Miyamoto et al. | 307/530 |
| 4,616,342 | 10/1986 | Miyamoto | 365/190 |
| 4,658,159 | 4/1987 | Miyamoto | 307/530 |
| 4,665,505 | 5/1987 | Miyakawa et al. | 365/177 |
| 4,713,796 | 12/1987 | Ogiue et al. | 365/225.6 |
| 4,745,580 | 5/1988 | Laymoun et al. | 365/179 |
| 4,829,479 | 5/1989 | Mitsumoto et al. | 365/189.09 |

FOREIGN PATENT DOCUMENTS 58-26392 2/1983 Japan .
59-203296 11/1984 Japan .
2154086 8/1985 United Kingdom .

OTHER PUBLICATIONS

J. Miyamoto et al., "A 28ns CMOS SRAM with Bipolar Sense Amplifiers", IEEE Internation Solid-State Circuits Conference, Digest of Technical Papers 1984, pp. 224-225.

Primary Examiner—Joseph A. Popek
Attorney, Agent, or Firm—Antonelli, Terry, Stout & Kraus

[57] ABSTRACT

A sense amplifier in a semiconductor memory device comprising a differential pair of bipolar transistors whose bases are supplied with read signals appearing on a pair of common data lines pulled up to the side of a positive power source potential, a regulated current circuit which causes a constant current to flow from the common emitters of the pair of bipolar transistors, as well as regulated current circuits which bias the respective bases of the pair of bipolar transistors to the side of a negative power source potential, and a control circuit which switches and controls the respective regulated current circuits in accordance with the select state of the sense amplifier, and also comprising saturation preventive circuits which cause minute currents to flow from the respective bases of the pair of bipolar transistors toward the negative power source potential, so that the bipolar transistors are avoided from falling into saturated states when the regulated current circuits are turned "off," thereby making it possible to reduce the average power consumption of the memory device without delaying the operating speed thereof.

44 Claims, 3 Drawing Sheets

SEMICONDUCTOR MEMORY DEVICE

This application is a continuation of application Ser. No. 07/216,652, filed July 7, 1988, now abandoned.

BACKGROUND OF THE INVENTION

The present invention relates to a semiconductor memory device, and more particularly to techniques which are effective when applied to a semiconductor memory device having bipolar transistors and CMOS-FETs (complementary insulated-gate field effect transistors), this semiconductor memory device being hereinbelow termed a "semiconductor memory device of the bipolar-CMOS type." By way of example, the invention is effectively utilized for a static semiconductor memory device (hereinbelow, termed "S-RAM") of the bipolar-CMOS type, such as a bipolar-CMOS type S-RAM the levels of the input/output signals of which are compatible with those of the signals of ECL (emitter-coupled logic). The bipolar-CMOS type S-RAM is shown in Page 37-39 of NIKKEI ELECTRONICS 1986.12.29 (no. 411).

Figure 3:
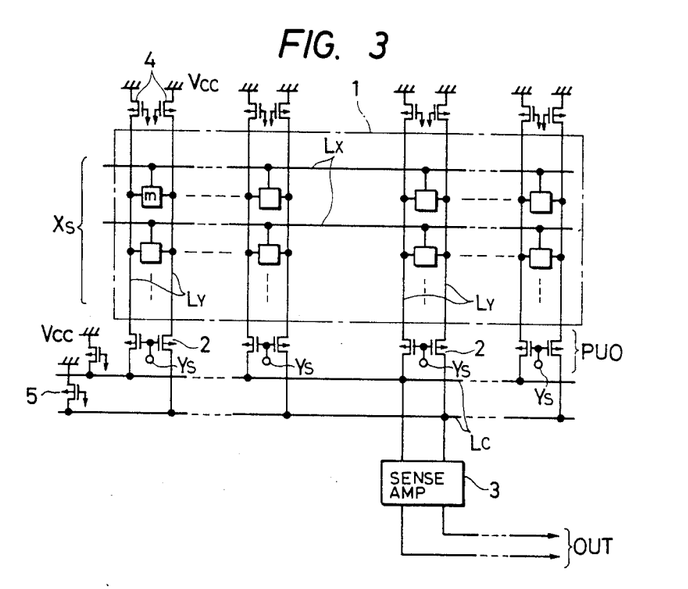
FIG. 3 is a block diagram showing the arrangement of a bipolar-CMOS S-RAM.

FIG. 3 shows a block diagram of a semiconductor memory device which was studied by the inventors prior to the present invention. The semiconductor memory device illustrated in the figure is a bipolar-CMOS type S-RAM the periphery of which is capable of signal level compatibility with ECL.

Referring to the figure, the semiconductor memory device includes a memory array 1 in which a large number of memory cells $\underline{m}$ are arrayed in the shape of a matrix. In the memory array 1, large numbers of word lines $L_X$ and data line pairs $L_Y$ are laid in order to select any desired ones of the memory cells $\underline{m}$. All the data line pairs $L_Y$ are connected to a common data line pair $L_C$ through Y select switches 2 respectively corresponding thereto, and the common data line pair $L_C$ is connected to the input terminals of a sense amplifier 3.

Symbol $X_S$ denotes word select signals, which select a desired word line from among the large number of word lines $L_X$ and drive it. In addition, symbol $Y_S$ denotes Y select signals, which select one of the Y select switches 2 and bring it into the "on" state. Thus, any desired memory cell $\underline{m}$ is selected from among the plurality of memory cells, and as read signals, data stored in the selected memory cell $\underline{m}$ is supplied therefrom to the sense amplifier 3 through the common data line pair $L_C$ which is pulled up to the side of a positive power source potential $V_{CC}$. The supplied read signals are amplified into read signals of predetermined levels by the sense amplifier 3. Thereafter, the read signals are delivered to external data terminals via an input/output buffer circuit or the like though this is not illustrated in the figure.

Each pair of data lines $L_Y$ and the pair of common data lines $L_C$ are respectively pulled up to the side of the positive power source potential $V_{CC}$ by pull-up circuits 4 and 5 constructed of P-channel MOSFETs (insulated-gate field effect transistors). On the pair of common data lines $L_C$, there appear the minute read signals which oscillate slightly to the side of a negative power source potential with the positive power source potential $V_{CC}$ as a reference level. These minute read signals are amplified by the sense amplifier 3.

SUMMARY OF THE INVENTION

Figure 4:
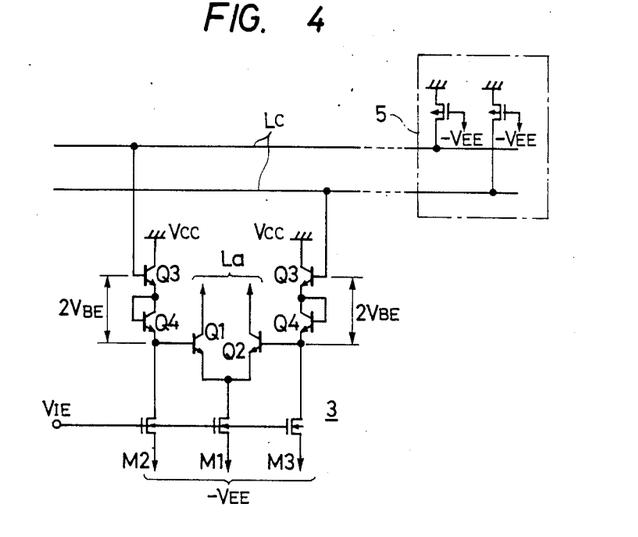
FIG. 4 is a circuit diagram showing a sense amplifier and the peripheral circuit thereof in the bipolar-CMOS S-RAM which was studied prior to the present invention.

Shown in FIG. 4 is a practicable circuit arrangement which was contrived as the sense amplifier 3 by the inventors.

As illustrated in the figure, the sense amplifier 3 is configured of n-p-n bipolar transistors Q1–Q4 and N-channel MOSFETs M1–M3.

The bipolar transistors Q1 and Q2 have their emitters connected in common, thereby to construct a pair of differential transistors.

The bipolar transistors Q3 and Q4 are disposed in two sets. Each of the sets constructs a level shift circuit which utilizes a forward voltage drop ($V_{BE}$) developing across the base and emitter of the bipolar transistor. The level shift circuits construct the input circuits of the sense amplifier 3, and they are respectively inserted in series between the pair of common data lines $L_C$ and the bases of the pair of bipolar transistors Q1 and Q2. Owing to these level shift circuits, the potentials ($V_{CC} \sim V_{CC} - \Delta V$: where $\Delta V$ denotes a read signal component) appearing on the pair of common data lines $L_C$ have their levels shifted to the side of the negative power source potential $-V_{EE}$ in correspondence with 2 $V_{BE}$ (2 $V_{BE} \approx 2 \times 0.8$ V = 1.6 V), whereupon they are transmitted to the bases of the corresponding transistors Q1 and Q2.

The MOSFET M1 has a predetermined control voltage $V_{IE}$ applied to its gate, thereby to construct a first regulated current circuit for causing a constant current to flow from the common emitters of the pair of bipolar transistors Q1 and Q2.

The MOSFETs M2 and M3 construct second and third regulated current circuits which bias the base potentials of the pair of bipolar transistors Q1 and Q2 to the side of the negative power source potential $-V_{EE}$, respectively.

Owing to the construction stated above, the read signals appearing on the pair of common data lines $L_C$ are shifted to appropriate levels and are supplied to the bases of the differential amplifier transistors Q1 and Q2, by which they are amplified. Output signals produced by the differential amplification are derived from the collectors of the pair of bipolar transistors Q1 and Q2.

Here, for the purpose of reducing the average power consumption of the foregoing semiconductor memory device, the inventors considered the measure that the control voltage $V_{IE}$ is supplied only when the chip is selected, namely, only when the bipolar-CMOS S-RAM is brought into the selected state. With this measure, the sense amplifier 3 is selectively operated according to the selection and non-selection of the chip. More concretely, save when the chip is selected, the control voltage $V_{IE}$ is set at its low level (the negative power source potential side) to bring the MOSFETs M1, M2 and M3 into the "off" states, whereby the sense amplifier 3 is brought into the non-operating state to lower the operating currents thereof.

However, it has been revealed by the inventors that a problem to be described below is involved in the above technique:

In the sense amplifier 3 illustrated in FIG. 4, when the MOSFETs M1, M2 and M3 constructing the regulated current circuits are turned "off," the voltages of 2 $V_{BE}$ to have their levels shifted by the bipolar transistors Q3 and Q4 decrease. As a result, the bipolar transistors Q1 and Q2 constituting the differential pair have their base potentials raised to the side of the positive power source potential $V_{CC}$, so that the differential pair of transistors fall into the saturated states thereof.

Once the bipolar transistors Q1 and Q2 have fallen into the saturated states, a long time is required till breakaway from the saturated states even when the MOSFETs M1, M2 and M3 are brought into the "on" states again. The delay time appears in the form of the delay of an access time in the semiconductor memory device.

As explained above, the foregoing semiconductor memory device has the problem that, when the sense amplifier is switched between the operating state and the non-operating state in order to reduce the power consumption, the delay of the operation of the semiconductor memory device is attended with.

An object of the present invention is to provide a semiconductor memory device which attains a reduced power consumption while preventing its operating speed from lowering.

Another object of the present invention is to provide a technique according to which a sense amplifier in a semiconductor memory device can be switched between the operating state and the non-operating state thereof at high speed, thereby making it possible to reduce the average power consumption of the semiconductor memory device without delaying the operation thereof.

The above and other objects and novel features of the present invention will become apparent from the description of this specification and the accompanying drawings.

A typical aspect of performance of the present invention is briefly summarized as follows:

A sense amplifier which is supplied with stored data from a pair of common data lines pulled up to the side of a positive power source potential, comprises a pair of bipolar transistors which have their emitters connected in common thereby to construct a differential pair, input circuits by which potentials appearing on the pair of common data lines are respectively transmitted to the bases of the pair of bipolar transistors, a first regulated current circuit which causes a constant current to flow from the common emitters of the pair of bipolar transistors to the side of a negative power source potential, second and third regulated current circuits by which the base potentials of the pair of bipolar transistors are respectively biased to the side of the negative power source potential, a control circuit by which currents to flow to the first, second and third regulated current circuits are controlled "on" and "off" in accordance with selection states, and energization circuits by which minute currents are respectively caused to flow from the bases of the pair of bipolar transistors toward the negative power source potential side.

According to the expedient described above, even when the currents to flow to the respective regulated current circuits are cut off in order to reduce power consumption, the base potentials of the pair of bipolar transistors constructing the differential pair can be always held lower than the positive power source potential by a predetermined level owing to the minute currents caused to flow by the energization circuits. Thus, the bipolar transistors can be prevented from falling into the saturated states thereof, and the sense amplifier can be switched from the non-operating state into the operating state thereof at high speed.

The switching between the non-operating state and the operating state of the sense amplifier is quickly performed in the above way, thereby to accomplish the object that the average power consumption is permitted to decrease without delaying the operation of the semiconductor memory device.

DESCRIPTION OF THE PREFERRED EMBODIMENTS

Figure 1:
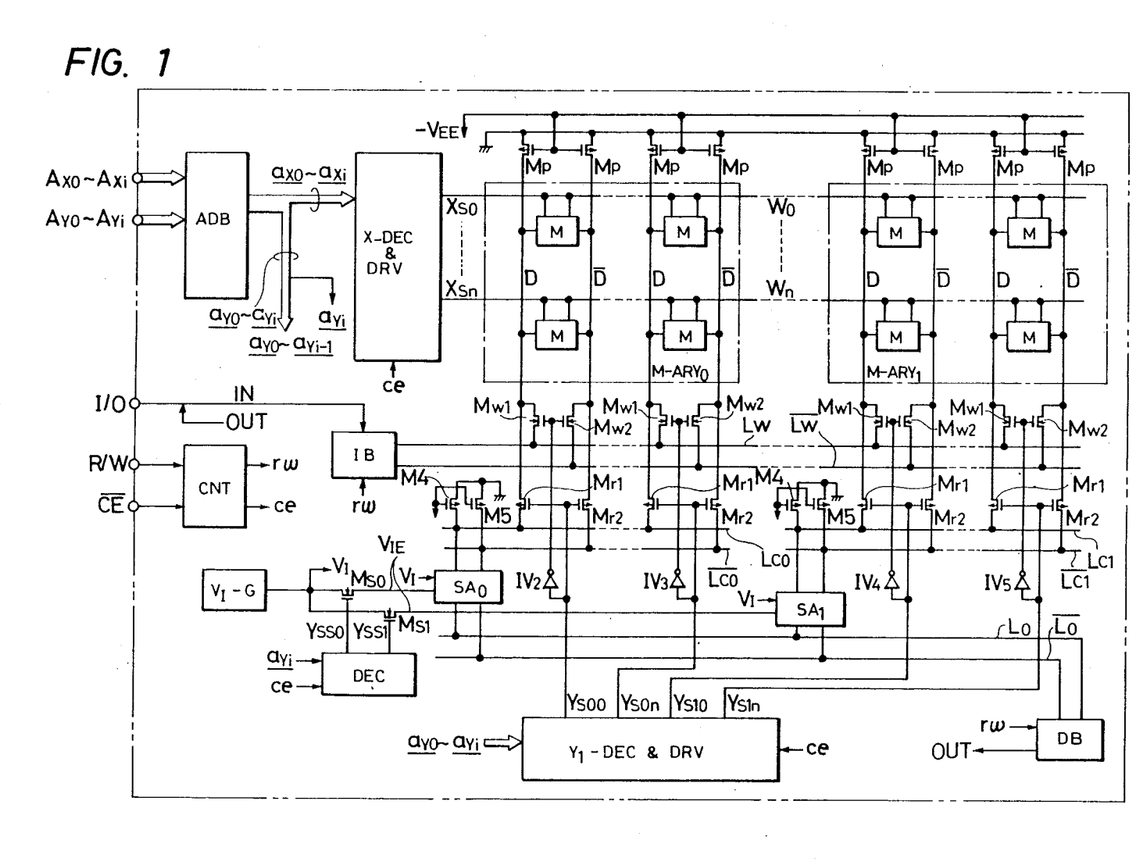
FIG. 1 is a block diagram showing the blocks of a bipolar-CMOS S-RAM which is an embodiment of the present invention.

Shown in FIG. 1 is a block diagram of a bipolar-CMOS S-RAM to which the present invention is applied. Although not especially restricted, the S-RAM illustrated in the figure have input/output signals whose levels are compatible with signal levels of ECL. In the figure, various circuit blocks enclosed with a two-dot chain line are formed on a single semiconductor substrate by well-known techniques for semiconductor integrated circuits.

Referring to the figure, symbols M-ARY$_0$ and M-ARY$_1$ denote memory arrays, respectively. Each of the memory arrays M-ARY$_0$ and M-ARY$_1$ includes a plurality of memory cells M which are arranged in the shape of a matrix, word lines W$_0$-W$_n$ to each of which the select terminals of the memory cells arranged in an identical row are coupled, and complementary data line pairs D, $\overline{D}$ to each of which the input/output terminals of the memory cells arranged in an identical column are coupled. P-channel MOSFETs M$_p$ constructing the load circuits of the respective complementary data lines D and $\overline{D}$ are interposed between the individual complementary data lines and a positive power source potential (which is the ground potential in the embodiment) V$_{CC}$. Although not especially restricted, the P-channel MOSFETs M$_p$ have their gates coupled to a negative power source potential $-V_{EE}$.

A block ADB in the figure is an address buffer circuit, which receives X address signals A$_{X0}$-A$_{Xi}$ supplied through external terminals for the X-group address signals and then forms internal complementary address signals A$_{x0}$-A$_{xi}$ and $\overline{A_{x0}}$-$\overline{A_{xi}}$. For the facility of the ensuing description and the brevity of the illustration, the internal address signal a$_{x0}$ having the same phase as that of the external address signal A$_{X0}$ and the inverted internal address signal $\overline{a_{x0}}$ having the opposite phase thereto are expressed as an internal complementary address signal a$_{x0}$ in combination. Also the other address signals are similarly expressed. In addition, this address buffer circuit ADB receives Y address signals A$_{Y0}$-A$_{Yi}$ supplied through external terminals for the Y-group address signals and then forms internal complementary address signals a$_{Y0}$-a$_{Yi}$.

The internal complementary address signals a$_{X0}$-a$_{Xi}$ are supplied to an X-address decoder and driver X-DEC & DRV. Besides these address signals, an internal chip select signal ce is supplied to the X-address decoder and driver X-DEC & DRV. Although not especially restricted, the internal chip select signal ce is set at its high level (a potential on the side of the ground potential $V_{CC}$) when the bipolar-CMOS S-RAM is in the selected state thereof, namely, when the chip is in the selected state thereof, and it is set at its low level (a potential on the side of the negative power source potential $-V_{EE}$) when the chip is in the non-selected state thereof. When the chip has been brought into the selected state, the X-address decoder and driver X-DEC & DRV decodes the internal complementary address signals $a_{X0}$–$a_{Xi}$ supplied thereto and delivers a select signal to one of the plurality of word lines $W_0$–$W_n$ instructed by the internal complementary address signals $a_{X0}$–$a_{Xi}$. By way of example, the X-address decoder and driver X-DEC & DRV delivers the select signal of high level to the word line $W_0$ and non-select signals (of low level) to the remaining word lines $W_1$–$W_n$. One word line conforming to the internal complementary address signals $a_{X0}$–$a_{Xi}$ is supplied with the select signal, that is, one word line is selected, whereby the stored data items of the memory cells coupled to this word line are transmitted to the corresponding pairs of complementary data lines D and $\overline{D}$. In other words, the potentials of the pairs of complementary data lines D and $\overline{D}$ are changed according to the data stored in the memory cells.

A block $Y_1$-DEC & DRV in the figure is a Y-address decoder and driver, which receives the internal complementary address signals $a_{Y0}$–$a_{Yi}$ and decodes them when the chip is in the selected state. Thus, the Y-address decoder and driver $Y_1$-DEC & DRV forms a select signal which selects one of the plurality of complementary data line pairs D, $\overline{D}$ instructed by the internal complementary address signals $a_{Y0}$–$a_{Yi}$. By way of example, in a case where the complementary data line pair at the left end as viewed in the figure is instructed by the internal complementary address signals $a_{Y0}$–$a_{Yi}$, the Y-address decoder and driver $Y_1$-DEC & DRV delivers the select signal $Y_{S00}$ of low level and non-select signals $Y_{S0n}$, $Y_{S10}$ and $Y_{S1n}$ of high level.

In this way, one memory cell specified by the X-address decoder and driver X-DEC & DRV and the Y-address decoder and driver $Y_1$-DEC & DRV is selected from among the plurality of memory cells. In a case where the S-RAM is in a read mode, the data having been stored in the selected memory cell M is amplified by a sense amplifier $SA_0$ and is delivered to an external terminal I/O through an output buffer circuit DB including a main amplifier, etc. In contrast, in a case where the S-RAM is in a write mode, data supplied to the external terminal I/O is transmitted to and written into the selected memory cell M through an input buffer circuit IB including a write circuit, etc.

In the present embodiment, although no special restriction is intended, a pair of common complementary data lines $L_W$ and $\overline{L_W}$ for writing and pairs of common complementary data lines $L_{C0}$ and $\overline{L_{C0}}$, and $L_{C1}$ and $\overline{L_{C1}}$ for reading are separated in order to raise the operating speed of the bipolar-CMOS S-RAM. In consequence, column switches are disposed in the two sorts of writing column switches and reading column switches. More specifically, N-channel MOSFETs $M_{w1}$ and $M_{w2}$ are respectively coupled between the pair of writing common complementary data lines $L_W$ and $\overline{L_W}$ and each pair of complementary data lines D and $\overline{D}$ as illustrated in the figure, and the output signals $Y_{S0}$-

$0$–$Y_{S1n}$ of the Y-address decoder and driver $Y_1$-DEC & DRV are supplied to the gates of the MOSFETs $M_{w1}$, $M_{w2}$ through respective inverters $IV_2$–$IV_5$. Thus, the MOSFETs $M_{w1}$, $M_{w2}$ function as the writing column switches and couple one of the complementary data line pairs D, $\overline{D}$ with the common complementary data lines $L_W$ and $\overline{L_W}$ in accordance with the output signals of the Y-address decoder and driver $Y_1$-DEC & DRV. The input buffer IB receives a read/write control signal rw. When this control signal rw is at its low level, the input buffer IB accepts the input data "in" supplied through the external terminal I/O and then forms write data having the same phase as that of the input data "in" and the inverted write data having the opposite phase to the phase thereof, these write data items being respectively delivered to the pair of writing common complementary data lines $L_W$ and $\overline{L_W}$. In contrast, when the read/write control signal rw is at its high level, the output nodes of the input buffer IB are rendered floating or a predetermined potential irrespective of the potential of the external terminal I/O.

The reading column switches are constructed of P-channel MOSFETs $M_{r1}$, $M_{r2}$ which are interposed between each pair of complementary data lines D, $\overline{D}$ and the pairs of reading common complementary data lines $L_{C0}$, $\overline{L_{C0}}$ and $L_{C1}$, $\overline{L_{C1}}$. As illustrated in the figure, the gates of these pairs of column switch MOSFETs $M_{r1}$ and $M_{r2}$ are respectively supplied with the output signals $Y_{S00}$–$Y_{S1n}$ of the Y-address decoder and driver $Y_1$-DEC & DRV. Thus, one of the pairs of complementary data lines D, $\overline{D}$ is selectively coupled to the pair of common complementary data lines $L_{C0}$, $\overline{L_{C0}}$ or $L_{C1}$, $\overline{L_{C1}}$.

In the present embodiment, although no special restriction is intended, the pairs of reading common complementary data lines are divided in correspondence with the memory arrays for the purpose of raising the operating speed. That is, the pair of reading common complementary data lines $L_{C0}$ and $\overline{L_{C0}}$ are laid in correspondence with the memory array M-ARY$_0$, while the pair of reading common complementary data lines $L_{C1}$ and $\overline{L_{C1}}$ are laid in correspondence with the memory array M-ARY$_1$.

Each of these pairs of common complementary data lines $L_{C0}$, $\overline{L_{C0}}$ and $L_{C1}$, $\overline{L_{C1}}$ is provided with a potential setting circuit for setting the potentials of the corresponding common data lines to a predetermined value. The potential setting circuit is configured of P-channel MOSFETs M4 and M5 which are inserted between the respective common complementary data lines $L_{C0}$ and $\overline{L_{C0}}$ ($L_{C1}$ and $\overline{L_{C1}}$) and the power source potential $V_{CC}$ and whose gates are coupled to the negative power source potential $-V_{EE}$. In addition, the input nodes of the sense amplifier $SA_0$ ($SA_1$) are coupled to the common complementary data lines $L_{C0}$ and $\overline{L_{C0}}$ ($L_{C1}$ and $\overline{L_{C1}}$), and the output nodes of both the sense amplifiers $SA_0$ and $SA_1$ are coupled to the input nodes of the output buffer DB through a pair of common complementary data lines $L_0$, $\overline{L_0}$ for outputting.

When the read/write control signal rw is at the high level, the output buffer DB amplifies complementary read data items on the pair of common complementary data lines $L_0$ and $\overline{L_0}$ and transmits the output data "out" to the external terminal I/O. In contrast, when the read/write control signal rw is at the low level, the output node of the output buffer DB is brought into the floating state. Thus, in the present embodiment, an external terminal for the input data "in" and an external terminal for the output data (read data) "out" are made common.

Symbol $V_I$-G denotes a control voltage generator circuit which forms a predetermined voltage $V_I$. As will be detailed later with reference to FIG. 2, the sense amplifiers SA$_0$ and SA$_1$ are brought into the operating states thereof when supplied with the voltage $V_I$ through respective N-channel MOSFETs M$_{S0}$ and M$_{S1}$ for switching. The switching MOSFETs M$_{S0}$ and M$_{S1}$ are switched and controlled by respective select signals Y$_{SS0}$ and Y$_{SS1}$ which are formed by a selector circuit DEC. The selector circuit DEC receives the internal complementary address signal a$_{Yi}$ and the internal chip select signal ce, and subject to the selected state of the chip, it forms the select signal Y$_{SS0}$ (or Y$_{SS1}$) of high level in accordance with the address signal a$_{Yi}$. On this occasion, the other signal Y$_{SS1}$ (or Y$_{SS0}$) becomes a non-select signal of low level. Thus, the selected one of the sense amplifiers SA$_0$ and SA$_1$ falls into the operating state. Further, when the internal chip select signal ce is at the low level, the selector circuit DEC responds thereto to form the non-select signals Y$_{SS0}$ and Y$_{SS1}$ of low level by which both the sense amplifiers are brought into the non-selected states thereof.

A block CNT in the figure is a control signal generator circuit, which is supplied with a chip select signal $\overline{CE}$ and a read/write control signal R/W through external terminals. The chip select signal $\overline{CE}$ is set at its low level when the bipolar-CMOS S-RAM is to be brought into the selected state, whereas it is set at its high level when the S-RAM is to be brought into the non-selected state. The read/write control signal R/W is set at its high level for the read mode of the S-RAM, and at its low level for the write mode. The control signal generator circuit CNT receives the chip select signal $\overline{CE}$ and substantially inverts the phase thereof so as to form the internal chip select signal ce, and it receives the read/write control signal R/W and forms the internal read/write control signal rw having substantially the same phase as that of the received signal.

Figure 5:
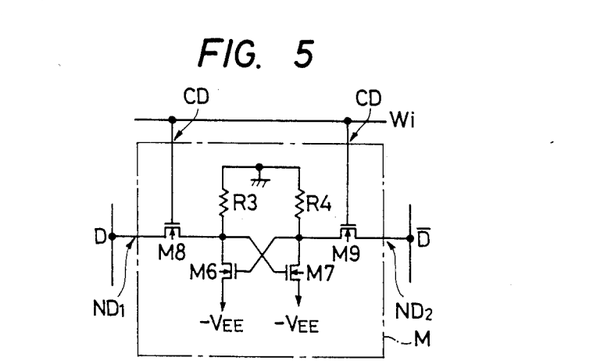
FIG. 5 is a circuit diagram showing an embodiment of a memory cell.

FIG. 5 shows a circuit diagram of an embodiment of the memory cell M. As seen from the figure, the memory cell M includes a flip-flop circuit which is configured of a pair of N-channel MOSFETs M6 and M7 having their gates and drains cross-connected to each other and polycrystalline-silicon resistors R3 and R4 of high resistance constituting the respective MOSFETs M6 and M7, and transferring N-channel MOSFETs M8 and M9 the source-drain paths of which are respectively inserted between the input/output nodes of the flip-flop circuit and the input/output terminals ND$_1$ and ND$_2$ of the memory cell M and the gates of which are connected to the select terminal CD of the memory cell M. Of course, the memory cell M may well be one which is configured of a CMOS-type flip-flop and transferring MOSFETs.

Figure 2:
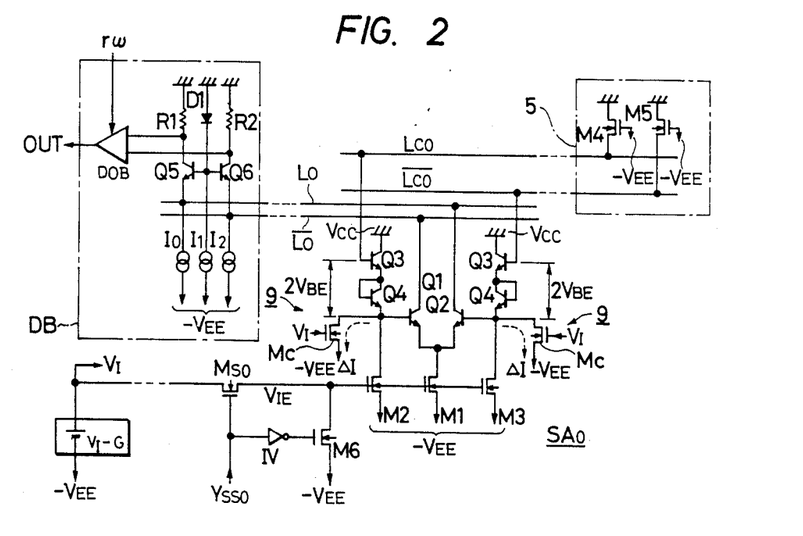
FIG. 2 is a circuit diagram showing a sense amplifier and the peripheral circuits thereof which form an embodiment of the present invention.

FIG. 2 shows an embodiment of the sense amplifier SA$_0$ as well as the output buffer DB, with the peripheral circuits thereof. As described with reference to FIG. 1, the pairs of reading common data lines are divided in the two sets, and the sense amplifiers are consequently disposed for the respective pairs of common complementary data lines L$_{C0}$, $\overline{L_{C0}}$ and L$_{C1}$, $\overline{L_{C1}}$. That is, one pair of common data lines L$_{C0}$ and $\overline{L_{C0}}$ (L$_{C1}$ and $\overline{L_{C1}}$) are laid in correspondence with a large number of complementary data line pairs D, $\overline{D}$, and one sense amplifier is coupled to each common data line pair L$_{C0}$, $\overline{L_{C0}}$ (L$_{C1}$, $\overline{L_{C1}}$). Since the sense amplifiers SA$_0$ and SA$_1$ are constructed to be similar to each other, the figure illustrates a practicable construction as to only the sense amplifier SA$_0$ which is coupled to the common complementary data lines L$_{C0}$ and $\overline{L_{C0}}$.

As stated before, the reading common data line pair L$_{C0}$, $\overline{L_{C0}}$ (L$_{C1}$, $\overline{L_{C1}}$) is provided with the potential setting circuit 5, by which the potentials of the common complementary data lines L$_{C0}$ and $\overline{L_{C0}}$ (L$_{C1}$ and $\overline{L_{C1}}$) are pulled up. That is, the potentials of the pair of common data lines L$_{C0}$ and $\overline{L_{C0}}$ (L$_{C1}$ and $\overline{L_{C1}}$) are respectively pulled up to the side of the positive power source potential V$_{CC}$ by the pulling-up P-channel MOSFETs M4 and M5 which constitute the potential setting circuit 5. Accordingly, minute read signals which oscillate slightly to the side of the negative power source potential $-V_{EE}$ with a reference level at the positive power source potential V$_{CC}$ and in accordance with the stored data of the selected memory cell appear on the paired common complementary data lines L$_{C0}$ and $\overline{L_{C0}}$ (L$_{C1}$ and $\overline{L_{C1}}$) which are coupled to the selected memory cell through the reading column switch. The minute read signals are detected and amplified by the sense amplifier SA$_0$ (SA$_1$).

The sense amplifier SA$_0$ illustrated in the figure is configured of n-p-n bipolar transistors Q1–Q4 and N-channel MOSFETs M1–M3. The bipolar transistors Q1 and Q2 have their emitters connected in common to each other, thereby to construct a differential pair of transistors. The MOSFET M1 has a predetermined control voltage V$_{IE}$ applied to its gate through the switching MOSFET M$_{S0}$ referred to in FIG. 1. When supplied with the control voltage V$_{IE}$, the MOSFET M1 forms a first regulated current circuit which causes a constant current to flow from the common emitters of the differential pair of bipolar transistors Q1 and Q2. Thus, a differential amplifier circuit is, in effect, formed by the differential pair of transistors Q1, Q2 and the MOSFET M1 for the regulated current.

As seen from the figure, the bipolar transistors Q3 and Q4 are disposed in two sets. Each of the sets constructs a level shift circuit which utilizes a forward voltage drop (V$_{BE}$) developing across the base and emitter of the bipolar transistor. The level shift circuits construct the input circuits of the sense amplifier SA$_0$. These input circuits are respectively inserted in series between the pair of reading common complementary data lines L$_{C0}$ and $\overline{L_{C0}}$ and the bases of the differential pair of bipolar transistors Q1 and Q2. More specifically, the bases of the level-shifting transistors Q3 are connected to the corresponding common data lines L$_{C0}$ and $\overline{L_{C0}}$, the collectors thereof are connected to the positive power source potential V$_{CC}$, and the emitters thereof are connected to the bases of the corresponding differential-amplifier transistors Q1 and Q2 through the diode-connected transistors Q4. The control voltage V$_{IE}$ is applied to the gates of the MOSFETs M2 and M3 through the switching MOSFET M$_{S0}$. When supplied with the control voltage V$_{IE}$, the MOSFETs M2 and M3 construct second and third regulated current circuits which bias the base potentials of the differential-amplifier bipolar transistors Q1 and Q2 to the side of the negative power source potential $-V_{EE}$, respectively. Owing to the level shift circuits, the potentials (V$_{CC}$~V$_{CC}$−ΔV: where ΔV denotes a read signal component) which appear on the paired common complementary data lines L$_{C0}$ and $\overline{L_{C0}}$ pulled up to the side of the positive power source potential V$_{CC}$ have their levels shifted to the side of the negative power source potential $-V_{EE}$ in correspondence with 2 $V_{BE}$ (2 $V_{BE} \approx 2 \times 0.8$ V = 1.6 V) and are input to the bases of the differential-amplifier bipolar transistors Q1 and Q2, respectively.

Owing to the circuit arrangement thus far described, the read signals which appear on the pair of common data lines $L_{C0}$ and $\overline{L_{C0}}$ pulled up to the side of the positive power source potential $V_{CC}$ are shifted to the appropriate levels and then supplied to the differential amplifier circuit. The output signals of the differential amplifier circuit are derived from the collectors of the pair of bipolar transistors Q1 and Q2.

The collectors of the differential pair of bipolar transistors Q1, Q2 are coupled to the output buffer DB through the pair of common complementary data lines $L_0$, $\overline{L_0}$. The output buffer DB is configured of resistors $R_1$, $R_2$, a diode D1, n-p-n bipolar transistors Q5, Q6, regulated current circuits $I_0$–$I_2$, and an output circuit DOB. The resistor $R_1$, the transistor Q5 and the regulated current circuit $I_0$ are connected in series between the positive power source potential $V_{CC}$ and the negative power source potential $-V_{EE}$, the common data line $L_0$ is connected to the connection node between the emitter of the transistor Q5 and the regulated current circuit $I_0$, and the collector of the transistor Q5 is connected to one input terminal of the output circuit DOB. In addition, the resistor $R_2$, the transistor Q6 and the regulated current circuit $I_2$ are connected in series between the potential $V_{CC}$ and the potential $-V_{EE}$, the emitter of the transistor Q6 is connected to the common data line $\overline{L_0}$, and the collector of the transistor Q6 is connected to the other input terminal of the output circuit DOB. The diode D1 and the regulated current circuit $I_1$ are connected in series between the potentials $V_{CC}$ and $-V_{EE}$, thereby to construct a bias circuit for biasing the bases of the transistors Q5 and Q6 to a predetermined potential. When the read/write control signal rw is at the high level, the output circuit DOB forms the output data "out" which has a predetermined logic level in accordance with complementary signals supplied to the pair of input terminals of this circuit DOB. In contrast, when the control signal rw is at the low level, the output terminal of the output circuit DOB is brought into the floating state thereof. The base potentials of the bipolar transistors Q5 and Q6 are fixed to the substantially constant potential (the forward voltage of the diode D1) by the function of the diode D1. Thus, also the potentials of both the common complementary data lines $L_0$ and $\overline{L_0}$ are, in effect, fixed to the predetermined potential. That is, the potential of the data line $L_0$ ($\overline{L_0}$) becomes the substantially constant potential which is determined by the forward voltage of the diode D1 and the base-emitter forward voltage of the transistor Q5 (Q6). The output signals of the differential pair of transistors Q1 and Q2 develop in the form of signals of currents flowing to the corresponding resistors $R_2$ and $R_1$, and the current signals are converted by the respective resistors $R_2$ and $R_1$ into voltage signals which are then transmitted to the output circuit DOB. In this way, the differential pair of transistors Q1 and Q2 need not charge and discharge the parasitic capacitances of the respective common data lines $\overline{L_0}$ and $L_0$, so that enhancement in the operating speed of the S-RAM can be achieved.

In the present embodiment, in order to reduce the power consumption of the bipolar-CMOS S-RAM, only one of the sense amplifiers $SA_0$ and $SA_1$ with which the memory cell is to be coupled, that is, only one sense amplifier coupled to the pair of reading common complementary data lines to which the information of the memory cell has been transmitted, is supplied with the control voltage $V_{IE}$ so as to be operated. On this occasion, the other sense amplifier is not supplied with the control voltage $V_{IE}$. Thus, the other sense amplifier has its MOSFETs M1, M2 and M3 turned "off" and is held in the non-operating state consumptive of no operating current.

The control voltage $V_I$ is formed by the control voltage generator circuit $V_I$-G. The switching circuit constructed of the MOSFET $M_{S0}$ ($M_{S1}$) is interposed in series between the control voltage generator circuit $V_I$-G and each sense amplifier $SA_0$ ($SA_1$) The switching circuit is switched and controlled by the select signal $Y_{SS0}$ ($Y_{SS1}$) which is supplied from the selector circuit DEC. The select signals $Y_{SS0}$ and $Y_{SS1}$ are obtained by decoding the Y-address signals. Alternatively, they can be derived from pre-decode outputs which are obtained in the course of decoding the plurality of Y-address signals. The select signals $Y_{SS0}$ and $Y_{SS1}$ thus obtained are supplied as the control signals (gate signals) to the switching circuits. By way of example, in a case where the select signal $Y_{SS0}$ of high level and the select signal $Y_{SS1}$ of low level are formed by the selector circuit DEC, the MOSFET $M_{S0}$ constructing the switching circuit is turned "on," and the MOSFET $M_{S1}$ (in FIG. 1) constructing the other switching circuit is turned "off." Thus, the gates of the MOSFETs M1–M3 in the sense amplifier $SA_0$ are supplied with the control voltage $V_I$ turned into the control voltage $V_{IE}$, through the switching MOSFET $M_{S0}$. Meantime, the gates of the MOSFETs M1–M3 (not shown) in the sense amplifier $SA_1$ are not supplied with the control voltage $V_{IE}$ because of the "off" state of the switching MOSFET $M_{S1}$. Thus, the power consumption in the sense amplifier $SA_1$ can be reduced.

Further, in order to prevent the sense amplifier $SA_0$ ($SA_1$) from operating erroneously when the control voltage $V_{IE}$ is not supplied and also to reliably attain the reduction of the power consumption, the sense amplifier $SA_0$ ($SA_1$) is provided with an inverter $IV_1$ which serves to invert the phase of the select signal $Y_{SS0}$ ($Y_{SS1}$), and a pulling-down N-channel MOSFET M6 the operation of which is controlled by the output signal of the inverter $IV_1$. The pulling-down MOSFET M6 functions to supply the negative potential $-V_{EE}$ to the gates of the MOSFETs M1–M3 through its predetermined "on" resistance while the switching MOSFET $M_{S0}$ ($M_{S1}$) is held in the "off" state by the select signal $Y_{SS0}$ ($Y_{SS1}$).

In the above manner, there is constructed a control circuit by which the currents to flow through the first, second and third regulated current circuits are controlled (switched) according to the selected and non-selected states of the sense amplifier.

In addition to the construction described above, each of the sense amplifiers $SA_0$ and $SA_1$ is provided with energization circuits (saturation preventive circuits) 9 by which minute currents $\Delta I$ are respectively caused to flow steadily from the bases of the differential pair of bipolar transistors Q1 and Q2 toward the side of the negative power source potential $-V_{EE}$. Each of the energization circuits (saturation preventive circuits) 9 is constructed of an N-channel MOSFET $M_C$ the gate of which is steadily supplied with the control voltage $V_I$ formed by the control voltage generator circuit $V_I$-G, and the drain-source path of which is connected between the base of the corresponding transistor Q1 (Q2) and the node of the negative power source potential $-V_{EE}$.

The size of this MOSFET $M_C$ is made comparatively small. Thus, the energization circuit 9 is constructed of the N-channel MOSFET $M_C$ the "on" resistance of which is comparatively great. Owing to the saturation preventing MOSFET $M_C$, the minute current $\Delta I$ flows through the bipolar transistors Q3, Q4 and the MOSFET $M_C$ so that a voltage drop above a fixed value (for example, in excess of 1.43 V) may develop across the base and emitter of the respective transistors Q3 and Q4 constituting the level shift circuit.

Accordingly, even when all the MOSFETs M1, M2 and M3 constructing the regulated current circuits are brought into the "off" states, the base potentials of the pair of bipolar transistors Q1 and Q2 constituting the differential amplifier are always held lower than the positive power source potential $V_{CC}$ by the predetermined level. Thus, the bipolar transistors Q1 and Q2 can be prevented from falling into intensely saturated states. As a result, the sense amplifier can be switched between the non-operating state and the operating state at high speed. That is, the switching between the non-selected state of the sense amplifier being the state in which the regulated-current MOSFETs M1–M3 within the sense amplifier are turned "off" and the selected state of the sense amplifier being the state in which the regulated-current MOSFETs M1–M3 within the sense amplifier are turned "on" can be quickly effected. More specifically, even when the sense amplifier is brought into the non-selected state, the differential transistors Q1 and Q2 can be prevented from falling into the saturated states. Therefore, as soon as the sense amplifier is brought into the selected state, the differential transistors Q1 and Q2 can amplify (detect) the potential difference between the pair of reading common complementary data lines, and the operating speed of the S-RAM can be raised. If the differential transistors Q1 and Q2 are in the saturated states, minority carriers having been previously injected in the bases of the transistors Q1 and Q2 need to be removed when the sense amplifier is brought into the selected state. Consequently, a comparatively long time is expended before the signals of the data of the memory cell appearing on the pair of reading common complementary data lines are detected by the transistors Q1 and Q2, and the operating speed of the S-RAM is limited.

Here, it has been verified by the inventors that in the case where the level shift magnitude necessary for preventing the transistors Q1 and Q2 from falling into the intensely saturated states is the voltage drop in excess of, for example, 1.43 V ($2 V_{BE} > 1.43$ V) across both the transistors Q3 and Q4, about 1 $\mu$A suffices as the value of the minute current $\Delta I$ for inducting the voltage drop of the above magnitude. In this manner, increase in the power consumption attributed to the energization circuits 9 is as little as almost negligible.

In the above way, the switching of the sense amplifier between the non-operating state and the operating state can be effected at high speed, whereby reduction in the average power consumption is permitted without delaying the operation of the bipolar-CMOS S-RAM.

Moreover, according to the present embodiment, the selector circuit DEC has both the signals $Y_{SS0}$ and $Y_{SS1}$ set at the low level when the internal chip select signal ce is held at the low level, that is, when the chip is held in the non-selected state. In consequence, the MOSFETs M1–M3 in the respective sense amplifiers $SA_0$ and $SA_1$ are held in the "off" states, and the power consumption in the sense amplifiers are reduced. Meantime, the gates of the MOSFETs $M_C$ constructing the saturation preventive circuits described before are steadily supplied with the control voltage $V_I$, so that the differential bipolar transistors Q1 and Q2 can be prevented from falling into the saturated states. Therefore, when the chip is switched from the nonselected state into the selected state, the operating speed can be prevented from lowering.

Although, in the above, the invention made by the inventors has been concretely described in conjunction with embodiments, it is needless to say that the present invention is not restricted to the foregoing embodiments, but that it can be variously altered within a scope not departing from the purport thereof. By way of example, the energization circuits (saturation preventive circuits) 9 can alternatively be configured using bipolar transistors or resistors, and they may well be constructed so as to cause the minute currents $\Delta I$ to flow during only the non-selected state of the sense amplifier. The level shift circuits forming the input circuits may well be configured of diodes or any other regulated-voltage elements instead of the bipolar transistors Q3 and Q4.

Although, in the embodiment of FIG. 1, the case of the two memory arrays has been referred to, the present invention is also applicable to a semiconductor memory device which is provided with more memory arrays and in which the number of the sense amplifiers is increased accordingly. In this case, the sense amplifiers can be selectively brought into the operating states by increasing the sorts of address signals which are supplied to the selector circuit DEC. Alternatively, a single sense amplifier may well be provided in the semiconductor memory device. In this case, it is possible according to the present invention to prevent the operating speed of the semiconductor memory device from lowering when the semiconductor memory device (chip) is switched from the non-selected state into the selected state. Further, unlike those of the embodiment in FIG. 1, the pairs of reading common data lines and the pair of writing common data lines may well be constructed of pairs of common data lines for common uses. In addition, the present invention is also applicable to a semiconductor memory device to/from which data is input/output in multiple-bit unit, for example, in 8-bit unit. Moreover, data inputting and data outputting may well be performed by separate external terminals.

In the above, the invention made by the inventors has been chiefly described as to the case of application to a bipolar-CMOS S-RAM forming the background field of utilization thereof. However, the present invention is not restricted thereto, but it is applicable to various semiconductor memory devices.

What is claimed is:

1. A semiconductor memory device having a sense amplifier which amplifies read signals from a memory cell, comprising:
   a pair of bipolar transistors which are included in said sense amplifier and which have their emitters connected in common, thereby to construct a differential pair,
   input means for transmitting the read signals to bases of said pair of bipolar transistors, respectively, first current means coupled to the common emitters of said pair of bipolar transistors for providing an operating current, second and third current means coupled to said bases of said pair of bipolar transistors, respectively, for providing currents to bias said bases of said pair of bipolar transistors, output means coupled to collectors of said pair of bipolar transistors for providing an output signal in accordance with outputs provided from said collectors of said pair of bipolar transistors, and including a collector voltage setting circuit for setting voltages on said collectors of said pair of bipolar transistors at predetermined voltages, control means for controlling said currents to flow through said second and third current means, and saturation preventive means coupled to said bases of said pair of bipolar transistors, respectively, for preventing said pair of bipolar transistors from falling into saturation states.

2. A semiconductor memory device according to claim 1, wherein said input means comprises level shift circuits which are respectively coupled between a pair of data lines to be supplied with the read signals from the memory cell and the corresponding bases of said pair of bipolar transistors.

3. A semiconductor memory device according to claim 1, wherein each of said first, second and third current means comprises a MOSFET.

4. A semiconductor memory device according to claim 3, wherein said control means further controls an operation of said first current means and comprises a switching circuit which switches and controls a control voltage to be supplied to gates of said MOSFETs.

5. A semiconductor memory device according to claim 4, wherein a plurality of the memory cells are provided, and further comprising:

a large number of pairs of complementary data lines for selecting the memory cells in a column direction of said semiconductor memory device, wherein said large number of pairs of complementary data line pairs are divided into a plurality of groups of complementary data line pairs, and wherein said each group of complementary data line pairs is coupled to said sense amplifier and said pair of data lines in one set.

6. A semiconductor memory device according to claim 5, wherein a plurality of said switching circuits are provided so as to pair each sense amplifier, and wherein each of said plurality of switching circuits is switched and controlled by said control means in every said group of complementary data line pairs.

7. A semiconductor memory device according to claim 5, further comprising pull-up means coupled to said each data line pair and for pulling up said each data line pair to a predetermined potential.

8. A semiconductor memory device according to claim 1, wherein said saturation preventive means comprises one element selected from a group consisting of bipolar transistors and resistors, each of which causes a minute current to flow steadily.

9. A semiconductor integrated circuit comprising:

memory cells each storing data therein;

a data line to which the data stored in one of the memory cells is to be supplied, wherein a potential of the data line is biased to a level of first power source voltage of the semiconductor integrated circuit and changed toward a level of a second power source voltage of the semiconductor integrated circuit in accordance with the data supplied thereto, the first power source voltage being greater than the second power source voltage;

a sensing bipolar transistor having a base coupled to the data line via a level shift circuit and for providing at a collector thereof an amplified signal in response to a change of a voltage appearing on the base thereof;

first current supply means coupled to an emitter of the sensing bipolar transistor for supplying a current for operating the sensing bipolar transistor;

second current supply means coupled to the base of the sensing bipolar transistor for selectively providing a current biasing to the base of the sensing bipolar transistor in response to a control signal;

output means coupled to the collector of the sensing bipolar transistor and responsive to the amplified signal and for providing an output in accordance with the amplified signal, wherein the output means includes a collector voltage setting circuit coupled to the collector of the sensing bipolar transistor and for setting a voltage on the collector of the sensing bipolar transistor at a predetermined voltage; and saturation preventive means coupled to the base of the sensing bipolar transistor for preventing the sensing bipolar transistor from falling into a saturation state during a period when the second current supply means does not supply current biasing to the base of the sensing bipolar transistor.

10. A semiconductor integrated circuit according to claim 9, wherein the saturation preventive means includes a MOSFET having a source-drain path coupled to the base of the sensing bipolar transistor, and wherein the MOSFET in the saturation preventive means is always turned on to provide a current when the first and second power source voltages are supplied to the semiconductor integrated circuit.

11. A semiconductor integrated circuit according to claim 10, wherein the first current supply means provides the current in response to the control signal, and wherein the first and second current supply means include MOSFETs of an N-channel type, source-drain paths of which are respectively coupled to the emitter and base of the sensing bipolar transistor, and gates of which are coupled to receive a predetermined voltage signal which is supplied in response to supply of the control signal.

12. A semiconductor integrated circuit according to claim 11, wherein the sensing bipolar transistor comprises an NPN type bipolar transistor.

13. A semiconductor integrated circuit according to claim 12, wherein the level shift circuit includes bipolar transistors, base-emitter junctions of which are coupled in series between the data line and the base of the sensing bipolar transistor.

14. A semiconductor integrated circuit according to claim 13, wherein the collector voltage setting circuit includes a bipolar transistor having an emitter which is coupled to the collector of the sensing bipolar transistor, having a base which is coupled to receive a reference voltage between the first and second power source voltages, and having a collector which is coupled to receive the first power source voltage via a load element.

15. A semiconductor integrated circuit according to claim 14, wherein each of the memory cells includes at least one MOSFET.

16. A semiconductor memory device comprising:
- a first node to which a first power source potential is to be supplied;
- a second node to which a second power source potential is to be supplied;
- storing means for storing data therein;
- a pair of data lines to which read signals based on the data stored in the storing means are to be applied and potentials of which are biased to the first power source potential, wherein the potentials on the pair of data lines are changed according to supply of the read signals so that the potential on one of the pair of data lines is changed toward the second power source potential;
- data line potential setting means coupled between the first node and the respective pair of data lines for biasing the pair of data lines to the first power source potential;
- level shift means coupled to the respective pair of data lines for shifting levels of the potentials on the pair of data lines toward the second power source potential;
- a pair of bipolar transistors having their bases coupled to the level shift means so that one of the bases is coupled to one of the pair of data lines via the level shift means and the other of the bases is coupled to the other of the pair of data lines via the level shift means, and for providing at their collectors thereof output signals in response to outputs of the level shift means;
- first current supply means coupled between respective emitters of the pair of bipolar transistors and the second node for providing an operating current for the pair of bipolar transistors;
- second current supply means coupled between the respective bases of the pair of bipolar transistors and for selectively providing currents for biasing the bases of the pair of bipolar transistors;
- control means for controlling whether the second current supply means is in an operating state or in a non-operating state;
- saturation preventive means coupled between the respective bases of the pair of bipolar transistors and the second node and for preventing the pair of bipolar transistors from falling into a saturation state when the second current supply means is in a non-operating state; and
- output means coupled to the collectors of the pair of bipolar transistors and responsive to the output signals of the pair of bipolar transistors and for providing an external output signal, the output means including means coupled to the first and second nodes for biasing the collectors of the pair of the bipolar transistors at a predetermined potential between the first and second power source potentials.

17. A semiconductor memory device according to claim 16, wherein the saturation preventive means includes third current supply means for supplying predetermined currents so that a predetermined voltage drop develops across the level shift means to prevent the pair of bipolar transistors from falling into the saturation state when the second current supply means is in the non-operating state.

18. A semiconductor memory device according to claim 17, wherein the third current supply means includes first MOSFETs having their source-drain paths coupled to the respective bases of the pair of bipolar transistors and their gates coupled to receive a predetermined reference voltage.

19. A semiconductor memory device according to claim 18, wherein the data line potential setting means includes second MOSFETs of P-channel type having their source-drain paths coupled between the first node and the respective pair of data lines and their gates coupled to the second node.

20. A semiconductor memory device according to claim 19, wherein the first current supply means includes at least one third MOSFET having a source-drain path coupled between the emitters of the pair of bipolar transistors and the second node, and wherein the second current supply means includes fourth MOSFETs having their source-drain paths coupled between the respective bases of the pair of bipolar transistors and the second node.

21. A semiconductor memory device according to claim 20, wherein the third and fourth MOSFETs have their gates coupled to receive a control signal from the control means, and are of N-channel type.

22. A semiconductor memory device according to claim 19, wherein the level shift means includes level shift bipolar transistors, base-emitter junctions of which are coupled in series between the corresponding pair of data lines and the bases of the corresponding pair of bipolar transistors so that the voltages appearing on the pair of data lines are shifted by utilizing forward voltage drops developing across bases and emitters of the level shift bipolar transistors and are transmitted to the respective bases of the bipolar transistors.

23. A semiconductor memory device according to claim 22, wherein the bias means in the output means includes:
- a level shift diode and a first current source which are coupled between the first and second nodes;
- a first bipolar transistor having an emitter coupled to one of the collectors of the pair of bipolar transistors and coupled to the second node via a second current source, a base coupled to a connection node between the level shift diode and the first current source, and a collector coupled to the first node via a first load element; and
- a second bipolar transistor having an emitter coupled to the other of the collectors of the pair of bipolar transistors and coupled to the second node via a third current source, a base coupled to the connection node, and a collector coupled to the first node via a second load element.

24. A semiconductor memory device according to claim 16, wherein the storing means includes a static memory cell having a flip-flop circuit for storing the data therein.

25. A semiconductor memory device according to claim 16, wherein the pair of bipolar transistors includes NPN type bipolar transistors.

26. A semiconductor integrated circuit comprising:
- means for providing a read signal;
- a sensing bipolar transistor for amplifying the read signal from the means;
- input means coupled to a base of the sensing bipolar transistor for transmitting the read signal to the base of the sensing bipolar transistor;

output means coupled to a collector of the sensing bipolar transistor for receiving an output signal from the collector of the sensing bipolar transistor and generating an amplified output according to the output signal, wherein the output means includes a voltage setting circuit for setting a voltage on the collector of the sensing bipolar transistor at a predetermined voltage;

first current supply means coupled to an emitter of the sensing bipolar transistor for providing an operating current for the sensing bipolar transistor;

second current supply means coupled to the base of the sensing bipolar transistors and for providing a bias current;

control means coupled to the second current supply means for controlling whether the second current supply means is in an operation state or in a non-operation state; and saturation preventive means coupled to the base of the sensing bipolar transistor for preventing the sensing bipolar transistor from going into a saturation state when the second current supply means is controlled by the control means so as to be in the non-operation state.

27. A semiconductor integrated circuit according to claim 26, wherein the first and second current supply means include MOSFETs of which source-drain paths are respectively coupled to the emitter and base of the sensing bipolar transistor.

28. A semiconductor integrated circuit according to claim 26, wherein the saturation preventive means includes a MOSFET having a source-drain path coupled to the base of the sensing bipolar transistors and a gate coupled to receive a reference voltage for turning the MOSFET on.

29. A semiconductor integrated circuit according to claim 26, wherein the saturation providing means includes third current supply means for providing another bias current for biasing the base of the sensing bipolar transistor.

30. A semiconductor integrated circuit according to claim 26, wherein the providing means includes a memory cell for storing data to be read therein.

31. A semiconductor integrated circuit according to claim 26, wherein the input means includes a data line to be supplied with the read signal and a level shift circuit coupled between the data line and the base of the sensing bipolar transistor.

32. A semiconductor integrated circuit according to claim 26, wherein the sensing bipolar transistor is an NPN bipolar transistor.

33. An integrated memory device comprising:
a plurality of word lines;
a pair of data lines;
a plurality of memory cells coupled to the plurality of word lines and to the pair of data lines so that each memory cell is coupled to a word line;
a data input circuit;
a pair of writing data lines coupled to the data input circuit;
a pair of reading data lines;
switching means including a pair of first MOSFETs disposed between the pair of data lines and the pair of writing data lines, and a pair of second MOSFETs disposed between the pair of data lines and the pair of reading data lines;
differentially connected bipolar transistors having their bases electrically coupled to the pair of reading data lines, respectively, and having their emitters coupled in common;
first current means coupled to the common emitters of the differentially connected bipolar transistors for providing an operating current;
second and third current means coupled to the bases of the differentially connected bipolar transistors, respectively, for providing currents to bias the bases of the differentially connected bipolar transistors;
first control means for controlling whether the first to third current means are in an operating state or in a non-operating state;
saturation preventive means coupled to the respective bases of the differentially connected bipolar transistors for preventing the differentially connected bipolar transistors from falling into a saturation state when the first to third current means are in a non-operating state; and
data output means coupled to collectors of the differentially connected bipolar transistors for providing an output signal in response to output signals of the differentially connected bipolar transistors, and including means for setting the collectors of the differentially connected bipolar transistors at a predetermined voltage.

34. The device of claim 33, wherein each of the first to third current means includes a MOSFET having a gate coupled to the control means.

35. The device of claim 34, wherein each of the memory cells includes:
a pair of MOSFETs coupled to have their gates and drains cross-coupled to each other;
a pair of load elements coupled to the respective drains of the pair of MOSFETs; and
a pair of transfer gate MOSFETs having their gates coupled to one of the word lines, and their source-drain paths coupled between the pair of data lines and the drains of the pair of MOSFETs, respectively.

36. The device of claim 35, wherein the pair of first MOSFETs are of an N-channel conductivity type, and wherein the pair of second MOSFETs are of a P-channel conductivity type, further comprising:
load MOSFETs of a P-channel conductivity type coupled to the pair of data lines, respectively.

37. The device of claim 36, further comprising:
address input terminals for receiving address signals of an ECL level; and
selecting means coupled to the plurality of word lines and responsive to the address signals for selecting one of the plurality of word lines according to the address signals.

38. The device of claim 37, wherein the differentially connected bipolar transistors include NPN bipolar transistors.

39. The device of claim 38, wherein the MOSFETs in the first to third current means are of an N-channel conductivity type.

40. The device of claim 36, further comprising:
level shift elements coupled between the pair of reading data lines and the bases of the differentially connected bipolar transistors, respectively.

41. The device of claim 40, wherein the level shift elements include NPN bipolar transistors.

42. The device of claim 35, wherein the pair of load elements are comprised of polycrystalline silicon.

43. The device of claim 33, further comprising:

second control means coupled to the data input circuit and to the data output means and responsive to a predetermined state of a read/write control signal applied thereto, including means for enabling one of the data input circuit and the data output means in accordance with said predetermined state of said read/write control signal.

44. The device of claim 33, wherein the output signal has an ECL level.

* * * * *

UNITED STATES PATENT AND TRADEMARK OFFICE
CERTIFICATE OF CORRECTION

PATENT NO. : 4,984,207

DATED : Jan. 8, 1991

INVENTOR(S) : M. Tateno et al

It is certified that error appears in the above-identified patent and that said Letters Patent is hereby corrected as shown below:

Column 17, (claim 29) line 37, "providing" should read --preventive--.

Signed and Sealed this

Fifth Day of January, 1993

Attest:

DOUGLAS B. COMER

Attesting Officer

Acting Commissioner of Patents and Trademarks